United States Patent
Huh et al.

(10) Patent No.: US 6,637,443 B2
(45) Date of Patent: Oct. 28, 2003

(54) SEMICONDUCTOR WAFER CLEANING APPARATUS AND METHOD

(75) Inventors: Yun Jun Huh, Cheongji-si (KR); Suk Bin Han, Cheongji-si (KR); Jae Jeong Kim, Cheongji-si (KR)

(73) Assignee: LG Semicon Co., Ltd., Chungcheongbuk-do (KR)

( * ) Notice: Subject to any disclaimer, the term of this patent is extended or adjusted under 35 U.S.C. 154(b) by 0 days.

(21) Appl. No.: 10/326,486

(22) Filed: Dec. 23, 2002

(65) Prior Publication Data

US 2003/0084921 A1 May 8, 2003

Related U.S. Application Data

(62) Division of application No. 08/923,949, filed on Sep. 5, 1997, now Pat. No. 6,532,976, which is a continuation of application No. 08/499,991, filed on Jul. 10, 1995, now abandoned.

(51) Int. Cl.[7] ................................................. B08B 3/02
(52) U.S. Cl. ...................... 134/22.1; 134/25.4; 134/36
(58) Field of Search ........................... 134/902, 186, 134/199, 111, 110, 25.4, 36, 22.1

(56) References Cited

U.S. PATENT DOCUMENTS

| | | |
|---|---|---|
| 3,871,914 A | 3/1975 | Goffredo et al. |
| 4,092,176 A | 5/1978 | Kozai et al. |
| 4,197,000 A | 4/1980 | Blackwood |
| 4,361,163 A | 11/1982 | Aigo |
| 4,691,722 A | 9/1987 | Silvernail et al. |
| 4,753,258 A | 6/1988 | Seiichiro |
| 4,871,417 A | 10/1989 | Nishizawa et al. |
| 5,014,727 A | 5/1991 | Aigo |
| 5,027,841 A | 7/1991 | Breunsbach et al. |
| 5,069,235 A | 12/1991 | Vetter et al. |
| 5,071,776 A | 12/1991 | Matsushita et al. |
| 5,292,373 A | 3/1994 | Arita et al. |
| 5,370,142 A | 12/1994 | Nishi et al. |
| 5,383,483 A | 1/1995 | Shibano |
| 5,456,758 A | 10/1995 | Menon |
| 5,474,616 A | 12/1995 | Hayami et al. |
| 5,503,171 A | 4/1996 | Yokomizo et al. |
| 5,505,219 A | 4/1996 | Lansberry et al. |
| 5,520,205 A | 5/1996 | Guldi et al. |
| 5,540,247 A | 7/1996 | Kawatani et al. |
| 5,567,244 A | 10/1996 | Lee et al. |

FOREIGN PATENT DOCUMENTS

| | | |
|---|---|---|
| JP | 2-9124 | 1/1990 |
| JP | 4-134822 | 5/1992 |
| JP | 5-13393 | 1/1993 |
| JP | 5-182946 | 7/1993 |
| JP | 6-89889 | 3/1994 |

*Primary Examiner*—Frankie L. Stinson
(74) *Attorney, Agent, or Firm*—Morgan, Lewis & Bockius, LLP

(57) ABSTRACT

A semiconductor wafer cleaning apparatus comprises an outer tank, a cleaning tank provided within the outer tank, a wafer carrier provided within the cleaning tank, a plurality of jet nozzles directed toward the wafer carrier, a main pipe connected to the jet nozzles, a circulating pump connected to the main pipe and the outer tank for circulating a cleansing solution from the outer tank, through the main pipe, the jet nozzles, and the cleaning tank, and a filter for filtering the circulated cleansing solution.

8 Claims, 3 Drawing Sheets

FIG.1 - PRIOR ART
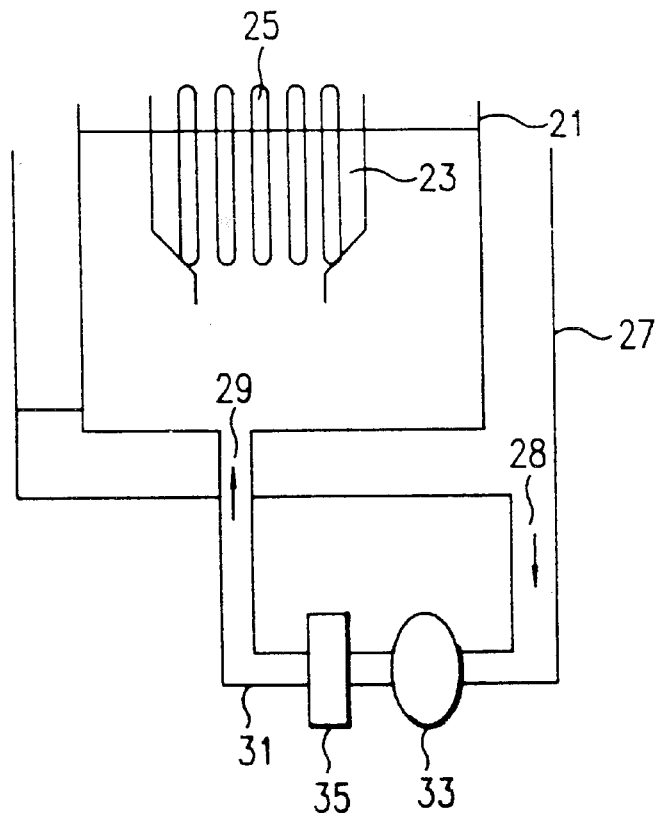
FIG.2 - PRIOR ART
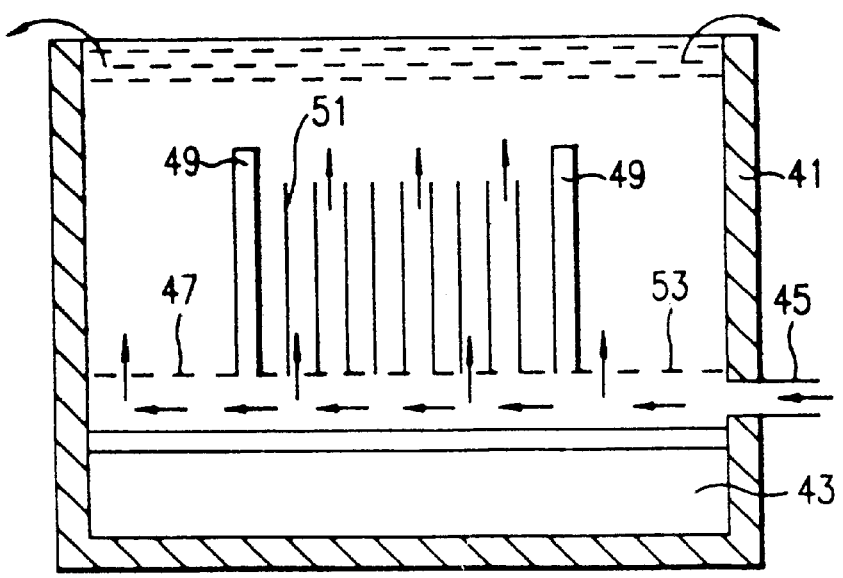

SEMICONDUCTOR WAFER CLEANING APPARATUS AND METHOD

This is a divisional of application Ser. No. 08/923,949 filed on Sep. 5, 1997, now U.S. Pat. No. 6,532,976, which is a file wrapper continuation of application Ser. No. 08/499,991 filed on Jul. 10, 1995, now abandoned.

BACKGROUND OF THE INVENTION

1. Field of the Invention

The present invention relates to a semiconductor wafer cleaning apparatus.

2. Description of the Related Art

Generally, with the high integration of semiconductor memory devices, micro-particles contained on the wafer surface exert a great influence on the characteristics of the semiconductor memory devices. Thus, recently, techniques for removing micro-particles contained on a wafer surface have become increasingly important in fabricating a semiconductor memory device.

Also, since the fabrication of a large wafer is currently under way, a large cleaning tank is necessary, and thus, the overall wafer cleaning apparatus occupies a large space. Therefore, conventionally, methods for diminishing the size of the cleaning tank have been proposed in order to prevent the volume increase of the wafer cleaning apparatus. However, if the volume of the wafer cleaning apparatus is reduced, the spacing between wafers becomes narrower, which decreases the homogeneity of reaction between the cleansing solution and each wafer and reduces the reaction effect, thereby disabling the overall wafers to be cleaned uniformly.

On the other hand, conventionally proposed wafer cleaning apparatuses have been adopting a Laminar flow method and a stirring method. Such conventional semiconductor wafer cleaning apparatuses will be described with reference to FIGS. 1 and 2.

FIG. 1 is a schematic diagram of a conventional semiconductor wafer cleaning apparatus adopting a Laminar flow method in which a wafer is carried within a cassette and is dipped into a cleansing solution to be cleaned.

As shown, the semiconductor wafer cleaning apparatus includes a wafer cleaning internal tank 21, a cassette 23 positioned within the internal tank 21 and having a wafer 25 carried therein, an outer tank 27 installed on the outer side of the internal tank 21 and having a cleansing solution outlet 28 formed through the sidewall thereof, a circulating pump 33 connected with a cleansing solution inlet 29 formed in the internal tank 21 for circulating the cleansing solution, and a filter 35 for filtering the circulated cleansing solution.

In the cleaning apparatus having the aforementioned configuration, first, the cleansing solution passes through the filter 35 by the operation of the circulating pump 33 and fills the internal tank 21 via the cleansing solution inlet 29. Thereafter, wafers 25 supported in the cassette 23 are dipped into the cleansing solution. At this time, the particles contained on the surface of the wafers 25 react with the cleansing solution to clean the wafers 25.

However, in the case of such apparatus, since the wafers dipped into the cleansing solution are only cleaned, the time for cleaning the wafers grows longer, thereby prolonging the fabrication processing time of overall semiconductor memory devices. Also, the cleansing efficiency is decreased to then deteriorate the cleaning uniformity on the whole surface of the wafers.

Another conventional semiconductor wafer cleaning apparatus is a stirring wafer cleaning apparatus using an ultrasonic generator, as shown in FIG. 2. As shown, an ultrasonic generator 43 is installed in a lower cleaning tank 41 and an inlet 45 is formed in the sidewall thereof for inducing pure water. A supporting plate 47 is installed within the cleaning tank 41, a wafer carrier 49 is installed on the supporting plate 47, and a plurality of wafers 51 are carried within the wafer carrier 49 with a predetermined spacing therebetween.

Also, a plurality of water holes 53 are formed on the supporting plate 47 so that the pure water passes toward the upper supporting plate 47 while being stirred by the ultrasonic generator 43. The pure water is turbulently stirred by the ultrasonic vibration generated by the ultrasonic generator 43 in the state where the cleaning tank 41 is filled with water.

Subsequently, impure particles stuck on the surface of wafers 51 collide with the stirred water and are thereby detached from the surface of the wafers 51, thereby allowing the cleaning of the wafers 51.

In the case of the wafer cleaning apparatus of FIG. 2, the cleaning process of the wafers 51 dipped in the cleaning tank 41 is similar to that performed by the Laminar flow method shown in FIG. 1. Since the apparatus of FIG. 2 is used for cleaning wafers by stirring pure water using the ultrasonic generator 43, it is more effective in cleaning wafers than the wafer cleaning apparatus adopting the above-described Laminar flow method. However, since a constant period of time should elapse in order to stir the water in the cleaning tank 41, the time for cleaning wafers is prolonged.

As described above, the conventional semiconductor wafer cleaning apparatus involves the following problems. First, when the wafer size is increased, the size of the cleaning tank should be increased accordingly. Thus, the overall wafer cleaning apparatus becomes larger. Second, if the pitch between wafers is made narrow for preventing the volume of the cleaning apparatus from being increased, the chemical reaction between the cleansing solution and wafers is retarded, thereby disabling the uniform cleaning of the overall surface of the wafers.

SUMMARY OF THE INVENTION

To solve the above problems, it is an object of the present invention to provide a semiconductor wafer cleaning apparatus using a jet nozzle which can reduce the overall wafer cleaning process and increase the wafer cleaning uniformity, by removing impure particles contained on the surface of the wafers using the jet nozzle in a short time.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the above objects and in accordance with the purpose of the invention, as embodied and broadly described herein, the semiconductor wafer cleaning apparatus of this invention comprises an outer tank, a cleaning tank installed in the outer tank, a wafer carrier provided within the cleaning tank, a plurality of jet nozzles directed toward the wafer carrier, a main pipe connected with the jet nozzles, a circulating pump connected with the main pipe and the outer tank for circulating a cleansing solution from the outer tank, through the main pipe, the jet nozzles, and the cleaning tank, and back to the outer tank, and a filter for filtering the circulated cleansing solution.

BRIEF DESCRIPTION OF THE DRAWINGS

The accompanying drawings, which are incorporated in and constitute a part of this specification illustrate embodiment of the invention and, together with the description, serve to explain the objects, advantages and principles of the invention. In the drawings, FIG. 1 is a schematic diagram of a conventional semiconductor wafer cleaning apparatus;

FIG. 2 is a schematic diagram of another conventional semiconductor wafer cleaning apparatus;

DETAILED DESCRIPTION OF THE INVENTION

Figure 3:
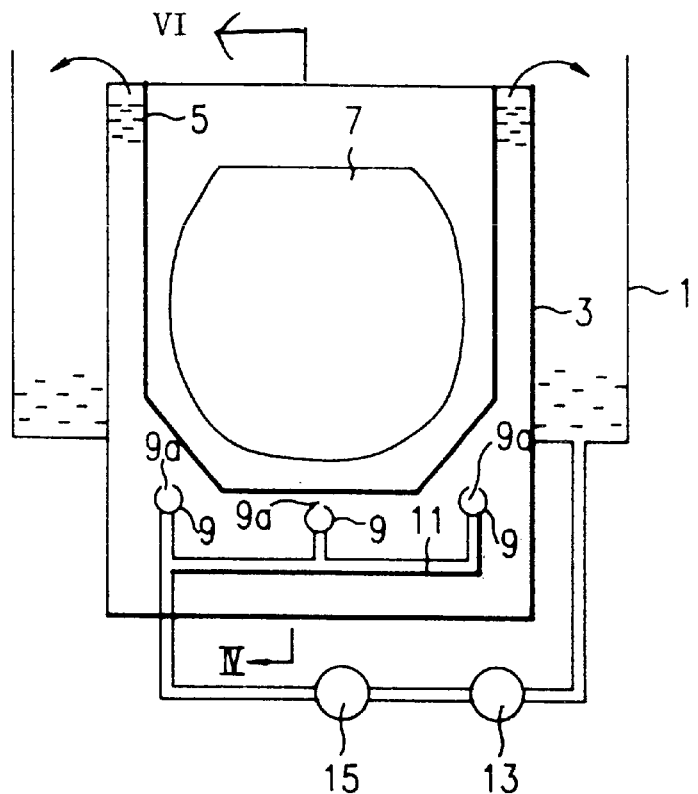
FIG. 3 is a schematic diagram of a semiconductor wafer cleaning apparatus according to the present invention.
Figure 4:
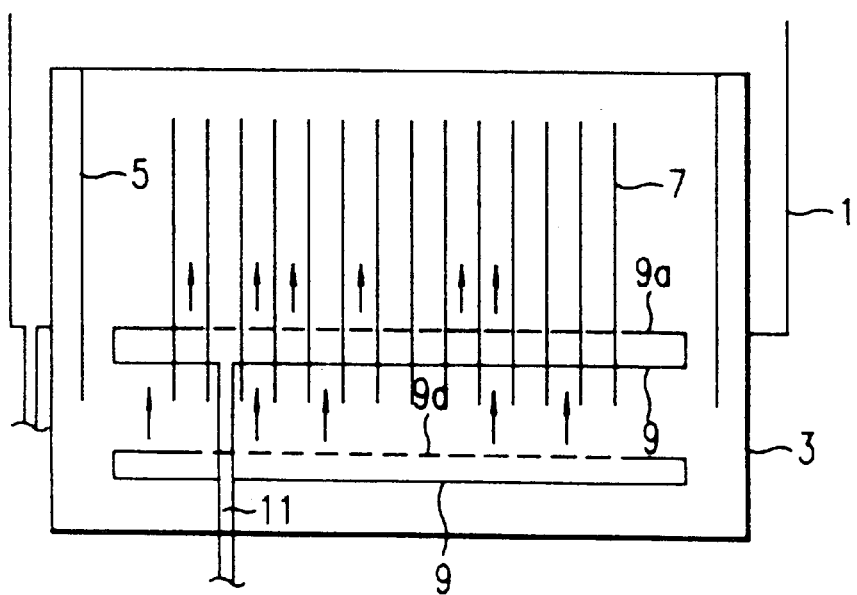
FIG. 4 is a side sectional view of the semiconductor wafer cleaning apparatus taken along line IV–VI of FIG. 3.

As shown in FIGS. 3 and 4, the semiconductor wafer cleaning apparatus according to the present invention includes an outer tank 1, a cleaning tank 3 installed in outer tank 1, a wafer carrier 5 installed in cleaning tank 3 for accepting a plurality of wafers 7, a plurality of jet nozzles 9 for spraying cleansing solution toward wafers 7, a main pipe 11 connected with jet nozzles 9, a circulating pump 13 installed between main pipe 11 and outer tank 1 for continuously circulating cleansing solution and a filter 15 for filtering the circulating cleansing solution.

Figure 5:
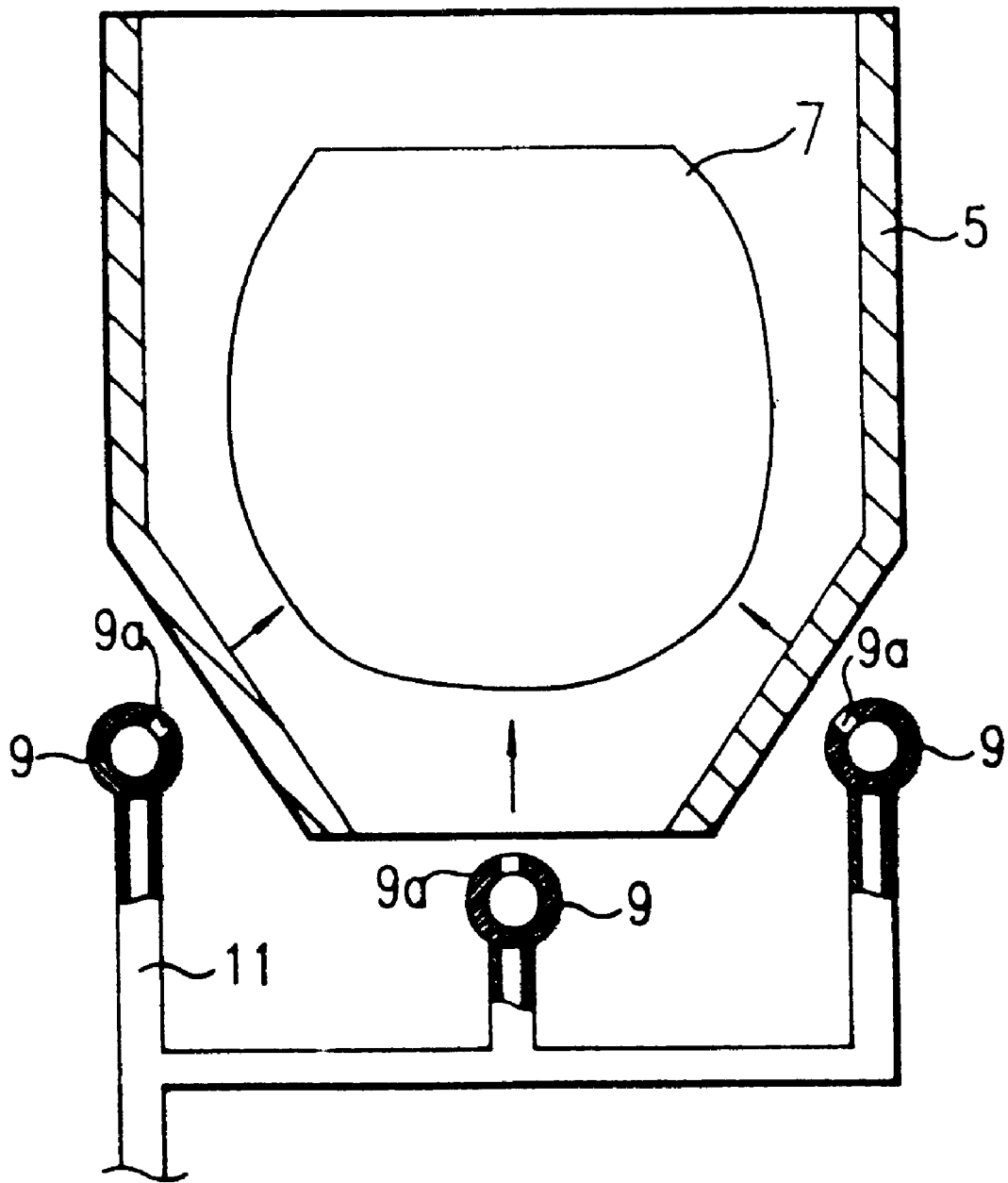
FIG. 5 is a partly enlarged sectional view of the semiconductor wafer cleaning apparatus according to the present invention, wherein the wafer carrier and jet nozzles are enlarged.

As shown in FIG. 5, the plurality of jet nozzles 9 are disposed to the left and right and below the wafer carrier 5 with a predetermined spacing there between. Also, a plurality of jet nozzle holes 9a are formed lengthwise in the plurality of jet nozzles 9 and face toward wafers 7. A cleansing solution is jetted through jet nozzle holes 9a obliquely against wafers 7 by a predetermined angle so that the particles present on the surface of wafers 7 are easily removed.

Operation of the semiconductor wafer cleaning apparatus having the aforementioned configuration according to the present invention will now be described.

During operation of the apparatus, a cleansing solution supplied from a separate cleansing solution source (not shown) is continuously circulated throughout the apparatus by circulating pump 13. As the cleansing solution is pumped from the outer tank 1, it passes through filter 15 where it is purified. The purified cleansing solution is then supplied to the respective jet nozzles 9 via main pipe 11.

The purified cleansing solution is jetted toward the plurality of wafers 7 via the jet nozzle holes 9a formed in the respective jet nozzles 9. Because the cleansing solution is strongly jetted toward wafers 7 in a spray-like manner, any particles stuck on the surfaces of the wafers 7 become detached.

Preferably, jet nozzles 9 are disposed as close to wafers 7 as possible and the cleansing solution is strongly jetted toward jet nozzle holes 9a such that the particles are easily removed from the surface of wafers 7. Also, preferably the cleansing solution is obliquely jetted toward wafers 7, such that the cleansing solution is jetted evenly on the entire surfaces of wafers 7. As the cleansing solution jetted from the jet nozzles 9a overflows cleaning tank 3, it is collected in outer tank 1. The collected cleansing solution is then recirculated by circulating pump 13 to be purified by filter 15 and used again to further detach particles from the surfaces of wafers 7.

EXAMPLE 1

One experiment of etching an oxide layer formed on the surface of wafers 7 was performed using HF in the ratio of 1 to 99 by a wafer cleaning apparatus using the jet method according to the present invention and by a wafer cleaning apparatus using the conventional Laminar flow method.

The experiment showed that the etching obtained by the jet method of the present invention was 53.9+9.3 Å/min, and that the etching rate obtained by the conventional Laminar flow method was 66.6+24.1 Å/min. Therefore, the etching rate according to the present invention using jet nozzles was maintained constantly, compared to that according to conventional Laminar flow method.

EXAMPLE 2

In another example, oxide layer etching rates were investigated using the jet method according to the present invention wherein pitches between wafers were 7.9 mm and 3.5 mm, respectively. In this experiment, HF in the ratio of 1 to 249 was used, the flux was 3.51/min, and two jet nozzles were used.

The experiment showed that the etching rate for the 7 mm wafer pitch was 29.7+2.2 Å/min, and that the etching rate for the 3.5 mm pitch was 29.2+1.5 Å/min. Therefore, the wafer cleaning uniformity of the present invention was kept constant irrespective of the cleaning tank size or wafer pitch spacing.

As described above, the semiconductor wafer cleaning apparatus according to the present invention has the following characteristics. First, since the cleansing solution is strongly jetted toward the wafers via jet nozzles, the particles on the surface wafers are easily removed. Second, since the time for removing the particles on the surface of wafers becomes shorter with the present invention, the wafer cleaning time is reduced. Third, the wafers are uniformly cleaned, irrespective of the pitch size between wafers.

The foregoing description of preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of cleaning a semiconductor wafer comprising the steps of:

placing a wafer inside a cleaning environment; and jetting a liquid against said wafer within said cleaning environment, wherein the step of placing a wafer includes placing the wafer inside a wafer carrier in the cleaning environment, and wherein the step of jetting includes directing a plurality of jet nozzles towards said water, each of said plurality of jet nozzles is located at a bottom center of the cleaning environment with the plurality of jet nozzle holes facing upward and a second of the plurality of jet nozzles is located at both sides of the cleaning environment with the plurality of jet nozzles holes facing a center of the wafer carrier at an oblique angle; and jetting the liquid directly onto left, right, and bottom sides of the wafer from the plurality of jet nozzles.

2. The method of cleaning a semiconductor wafer of claim 1, wherein said cleaning environment is a tank.

3. The method of cleaning a semiconductor wafer of claim 2, further comprising the step of recirculating said liquid through said tank.

4. The method of cleaning a semiconductor wafer of claim 1, wherein said liquid is a cleansing solution.

5. The method of cleaning a semiconductor wafer of claim 1, further comprising the step of filtering said liquid.

6. The method of cleaning a semiconductor wafer of claim 1, wherein said jetting step includes the step of jetting said liquid in a spray-like manner.

7. The method of cleaning a semiconductor wafer of claim 1, wherein said second jet nozzle is adjacent to said wafer.

8. The method of cleaning a semiconductor wafer of claim 1, wherein said plurality of jet nozzle holes formed lengthwise therethrough each of the plurality of jet nozzles.

* * * * *